(12) United States Patent
Pierrat

(10) Patent No.: US 6,808,850 B2
(45) Date of Patent: Oct. 26, 2004

(54) PERFORMING OPTICAL PROXIMITY CORRECTION ON TRIM-LEVEL SEGMENTS NOT ABUTTING FEATURES TO BE PRINTED

(75) Inventor: Christophe Pierrat, Santa Clara, CA (US)

(73) Assignee: Numerical Technologies, Inc., San Jose, CA (US)

( * ) Notice: Subject to any disclaimer, the term of this patent is extended or adjusted under 35 U.S.C. 154(b) by 176 days.

(21) Appl. No.: 10/277,250

(22) Filed: Oct. 21, 2002

(65) Prior Publication Data

US 2004/0076891 A1 Apr. 22, 2004

(51) Int. Cl.$^7$ ............................................... G03F 9/00
(52) U.S. Cl. ........................................................ 430/5
(58) Field of Search ...................... 430/5, 394; 716/19, 716/21

(56) References Cited

U.S. PATENT DOCUMENTS

| | | | |
|---|---|---|---|
| 5,994,002 A | 11/1999 | Matsuoka | 430/5 |
| 6,114,071 A | 9/2000 | Chen et al. | 430/5 |
| 2002/0076622 A1 | 6/2002 | Pierrat et al. | 430/5 |

OTHER PUBLICATIONS

Choi, Y., et al., "Optical Proximity Correction on Attenuated Phase Shifting Photo Mask for Dense Contact Array", LG Semicon Company (11 pages).

Toublan, O., et al., "Phase and Transmission Errors Aware OPC Solution for PSM: Feasibility Demonstration". Mentor Graphics Corp. (7 pages).

Rieger, M., et al., "System for Lithography Proximity Compensation". Precim Company, Portland, Oregon, Sep. 1993 (28 pages).

Spence, C., et al., "Integration of Optical Proximity Correction Strategies in Strong Phase Shifters Design for Poly–Gate Layers". Baeus News, vol. 15, Issue 12, pp. 1, 4–13, Dec. 1999.

Cooke, M., "OPC/PSM Designs For Poly Gate Layers", European Semiconductor, vol. 22, No. 7, pp. 57–59, Jul. 2000.

Schellenberg, F., et al., "OPC Beyond 0.18$\mu$m: OPC on PSM Gates", SPIE, vol. 4000, pp. 1062–1069, Mar. 1–3, 2000.

Toublan, O., et al., "Phase Aware Proximity Correction for Advanced Masks", SPIE, vol. 4000, pp. 160–170, Mar. 1–3, 2000.

*Primary Examiner*—S. Rosasco
(74) *Attorney, Agent, or Firm*—Park, Vaughan & Fleming, LLP

(57) ABSTRACT

One embodiment of the invention provides a system that performs optical proximity correction (OPC) on selected segments on a trim mask used in fabricating an integrated circuit. Upon receiving the trim mask, the system identifies selected segments on the trim mask that do not abut any feature to be printed on the integrated circuit. Next, the system performs a number of OPC operations. The system performs a first OPC operation on the selected segments to correct the selected segments. The system also performs a second OPC operation to correct segments on the trim mask that do abut features to be printed on the integrated circuit. The system additionally performs a third OPC operation on an associated phase shifting mask to correct segments that abut features to be printed on the integrated circuit. (Note that the first, second and third OPC operations can be performed separately or at the same time.)

45 Claims, 9 Drawing Sheets

PERFORMING OPTICAL PROXIMITY CORRECTION ON TRIM-LEVEL SEGMENTS NOT ABUTTING FEATURES TO BE PRINTED

BACKGROUND

1. Field of the Invention

The invention relates to the process of fabricating semiconductor chips. More specifically, the invention relates to a method and an apparatus for performing optical proximity correction (OPC) on selected trim-level segments that do not abut features to be printed on the integrated circuit.

2. Related Art

Recent advances in integrated circuit technology have largely been accomplished by decreasing the feature size of circuit elements on a semiconductor chip. As the feature size of these circuit elements continues to decrease, circuit designers are forced to deal with problems that arise as a consequence of the optical lithography process that is typically used to manufacture integrated circuits. This optical lithography process begins with the formation of a photoresist layer on the surface of a semiconductor wafer. A mask composed of opaque regions, which are generally formed of chrome, and light-transmissive clear regions, which are generally formed of quartz, is then positioned over this photoresist layer. (Note that the term "mask" as used in this specification is meant to include the term "reticle.") Light is then shone on the mask from a visible light source, an ultraviolet light source, or more generally some other type of electromagnetic radiation together with suitably adapted masks and lithography equipment.

This light is reduced and focused through an optical system containing a number of lenses, filters and mirrors. The light passes through the clear regions of the mask and exposes the underlying photoresist layer. At the same time, the light is blocked by opaque regions of the mask, leaving underlying portions of the photoresist layer unexposed.

The exposed photoresist layer is then developed, through chemical removal of either the exposed or non-exposed regions of the photoresist layer. The end result is a semiconductor wafer with a photoresist layer having a desired pattern. This pattern can then be used for etching underlying regions of the wafer.

Phase Shifting

As feature sizes continue to decrease, phase shifters are often incorporated into masks to achieve line widths that are smaller than the wavelength of the light that is used to expose the photoresist layer. During phase shifting, destructive interference caused by two adjacent clear areas on a phase shifting mask (PSM) is used to create an unexposed area on the photoresist layer. This is accomplished by exploiting the fact that light passing through a mask's clear regions has a phase that is a function of the distance the light travels through the mask material. By placing two clear areas adjacent to each other on the mask, one of thickness $t_1$ and the other of thickness $t_2$, one can obtain a desired unexposed area on the underlying photoresist layer caused by destructive interference. By varying the thickness $t_1$ and the thickness $t_2$ appropriately, the light exiting the material of thickness $t_2$ is 180 degrees out of phase with the light exiting the material of thickness $t_1$. Phase shifting is described in more detail in U.S. Pat. No. 5,858,580, entitled "Phase Shifting Circuit Manufacture Method and Apparatus," by inventors Yao-Ting Wang and Yagyensh C. Pati, filed Sep. 17, 1997 and issued Jan. 12, 1999.

Optical Proximity Correction

Optical proximity correction (OPC) is also used to improve printing of a layout. During the OPC process, additional features, such as "hammerheads," are often added onto features, such as line ends. The goal of OPC is to modify the layout such that the printed image of the modified layout more closely resembles the original layout. More generally, for an original layout T, OPC produces a modified layout T' such that the printed image of T' more closely resembles T. Additionally, the term OPC is used generically to refer to all types of proximity correction In some cases, OPC is applied to both a phase shifting mask as well as a trim mask. In some embodiments, the approach of U.S. patent application Ser. No. 10/082,697 entitled "Optical Proximity Correction For Phase Shifting Photolithographic Masks" having inventors Pierrat et. al., and filed 25 Feb. 2002 are used. For example, the top portion of FIG. 1 illustrates the use of that approach for a target polysilicon line 104 to be printed using phase shifting. The top portion of FIG. 1 illustrates the original layout along with one of the phase shifters, phase shifter 102, which would be located on a dark field alternating aperture phase shifting mask. The phase shifter 102 is placed to abut a portion of the polysilicon line 104. The bottom portion of FIG. 1 illustrates a corresponding trim mask 106 that protects the portions of the polysilicon line 104 to being printed with the phase shifting mask and defines the remainder of the line. In the example illustrated in FIG. 1, OPC is applied to segments 108–110 on the phase shifting mask that abut polysilicon line 104. (Note that evaluation points for the OPC operation are represented by crosses in FIG. 1.) OPC is also applied to segments 111–112 on the trim mask 106 that abut polysilicon line 104. Note also that the example in FIG. 1 has been highly simplified, to highlight the handling of OPC for phase shifted structures.

Design Process

A brief discussion of where PSM and OPC fit in one common circuit design process may be helpful. Masks to be used in wafer fabrication process are the final result of the design process. The process starts when a circuit designer produces a design in VHDL, or some other hardware description language. VHDL is an acronym for VHSIC Hardware Description Language. (VHSIC is a Department of Defense acronym that stands for very high-speed integrated circuits.) The VHDL standard has been codified in Institute for Electrical and Electronic Engineers (IEEE) standard 1076–1993.

The design then feeds through a layout system that performs a number of functions, such as synthesis, placement and routing and verification. The result is an integrated circuit (IC) layout, which is in the form of a hierarchical specification expressed in a format such as GDSII.

IC layout then passes into PSM and OPC post-processing systems, which can perform PSM conversion and proximity corrections.

The output of PSM and OPC post-processing system is a new IC layout. New IC layout subsequently passes into mask fabrication and inspection processes.

Wafer Fabrication Process

The produced masks can be used in wafer fabrication processes. The system starts by applying a photoresist layer to the top surface of a wafer. Next, the system bakes the photoresist layer. The system then positions the first mask over the photoresist layer, and exposes the photoresist layer through the first mask. Next, the system positions the second mask over the photoresist layer, and then exposes the photoresist layer through the second mask. In one embodiment of the invention, the first mask is a PSM mask and the second mask is a binary trim mask. However, note that the first mask and/or the second mask can include phase shifting regions. Next, the system optionally bakes the wafer again before developing the photoresist layer. Next, either a chemical etching or ion implantation step takes place before the photoresist layer is removed. (Note that in the case of a lift-off process, a deposition can take place.) Finally, a new layer of material can be added and the process can be repeated for the new layer.

Problems in Printing Cutouts

As integration densities continue to increase, it is becoming necessary to use phase shifters to define progressively more features within a layout. In fact, some integrated circuits are beginning to be fabricated using a "full phase" tape out methodology in which substantially all of the features in a layout are defined by phase shifters. However, the widespread use of phase shifters often leads to side-effects. For example, in FIG. 2, phase shifters 206 and 208 (which are of opposite phase) are used to define polysilicon regions 202 and 204. Unfortunately, the phase transition between phase shifters 206 and 208 results in an unexposed region 210 between polysilicon regions 202 and 204. This unexposed region 210 will cause unintended bridging between polysilicon regions 202 and 204. In order to remedy this problem, a subsequent exposure through a cutout 214 in trim 212 of trim mask 220 can be used to expose the unexposed region 210.

However, if the cutout 214 in trim 212 is too small, it may not allow sufficient light through to completely erase unexposed region 210. Moreover, conventional OPC may not help to alleviate this problem, because conventional OPC operates only on the top and bottom edges of cutout 214, which abut polysilicon regions 202 and 204. Adjusting only these edges may not allow sufficient light through to completely erase unexposed region 210.

What is needed is a method and an apparatus for alleviating the above-described exposure problem associated with cutouts on the trim mask.

SUMMARY

One embodiment of the invention provides a system that performs optical proximity correction (OPC) on selected segments on a trim mask used in fabricating an integrated circuit. Upon receiving the trim mask, the system identifies selected segments on the trim mask that do not abut any feature to be printed on the integrated circuit. Next, the system performs a number of OPC operations. The system performs a first OPC operation on the selected segments to correct the selected segments. The system also performs a second OPC operation to correct segments on the trim mask that do abut features to be printed on the integrated circuit. The system additionally performs a third OPC operation on an associated phase shifting mask to correct segments that abut features to be printed on the integrated circuit. (Note that the first, second and third OPC operations can be performed separately or at the same time.)

In a variation on this embodiment, for a given selected segment, the first OPC operation attempts to ensure a pre-specified intensity level at an evaluation point on the given selected segment. This pre-specified intensity level can be different than a feature-defining intensity level that is associated with a resist trigger that defines printed edges of features within the integrated circuit. Moreover, the pre-specified intensity level can include a range of intensity levels that suffice to erase underlying features on the integrated circuit.

In a variation on this embodiment, identifying the selected segments involves identifying segments associated with a set of cutouts on the trim mask.

In a further variation, the set of cutouts includes cutouts that erase side-effects generated by transitions between zero-degree regions and 180-degree regions on an associated phase shifting mask.

In a further variation, the set of cutouts includes cutouts that define line ends.

In a variation on this embodiment, the selected segments on the trim mask are corrected based only on a contribution of the trim mask.

In a variation on this embodiment, the selected segments on the trim mask are corrected based on a contribution of the trim mask as well as a contribution of an associated phase shifting mask.

In a variation on this embodiment, identifying the selected segments involves identifying segments associated with features on the trim mask that are too small to expose an underlying photoresist layer.

In a variation on this embodiment, identifying the selected segments involves identifying segments associated with features on the trim mask that are so large that the features cause an overexposure of an underlying photoresist layer.

In a variation on this embodiment, identifying the selected segments on the trim mask involves identifying segments associated with assist features, wherein the assist features are non-printing features that assist in printing other features on the integrated circuit.

BRIEF DESCRIPTION OF THE FIGURES

The patent or application file contains at least one drawing executed in color. Copies of this patent or patent application publication with color drawing(s) will be provided by the Patent and Trademark Office upon request and payment of the necessary fee.

DETAILED DESCRIPTION

Cutout between Phase Shifters

Figure 1:
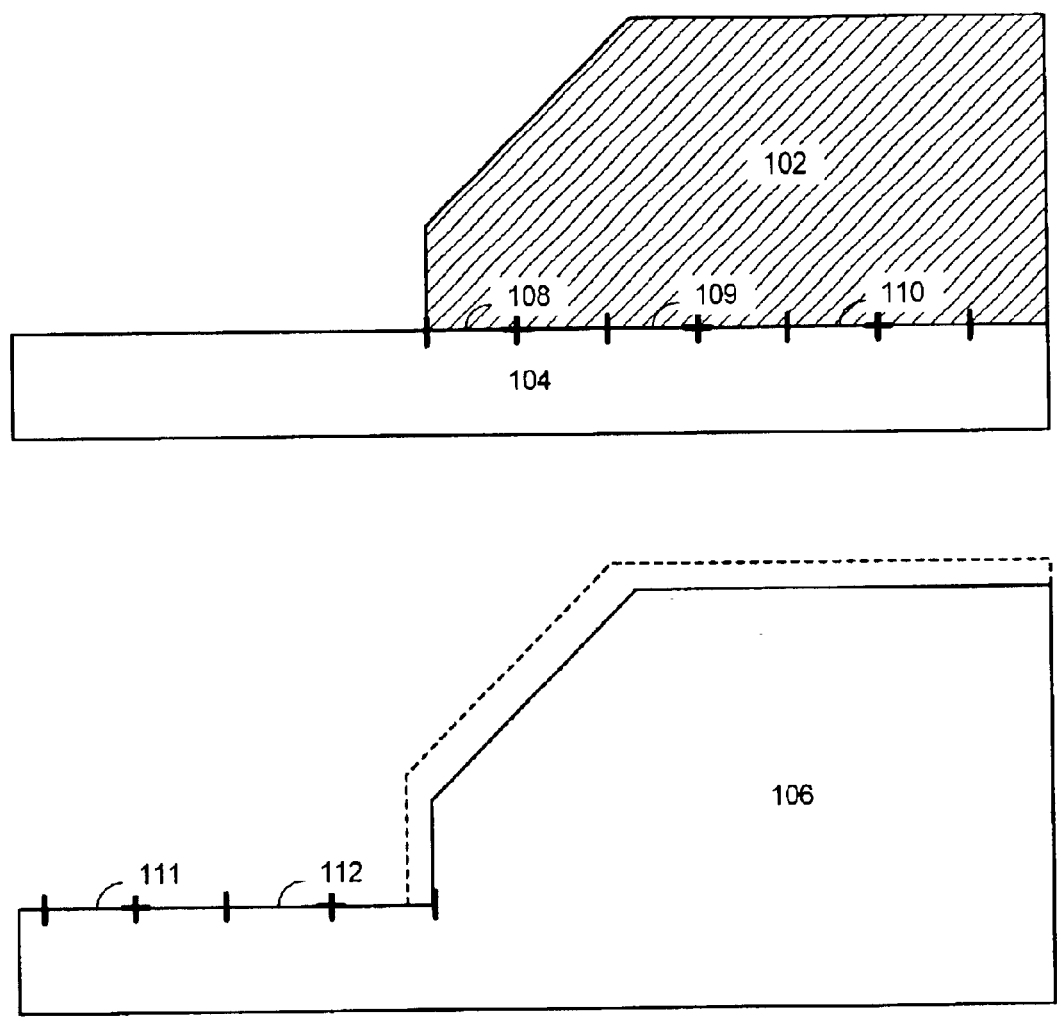
FIG. 1 illustrates how OPC is applied to both a phase shift mask and a trim mask.
Figure 2:
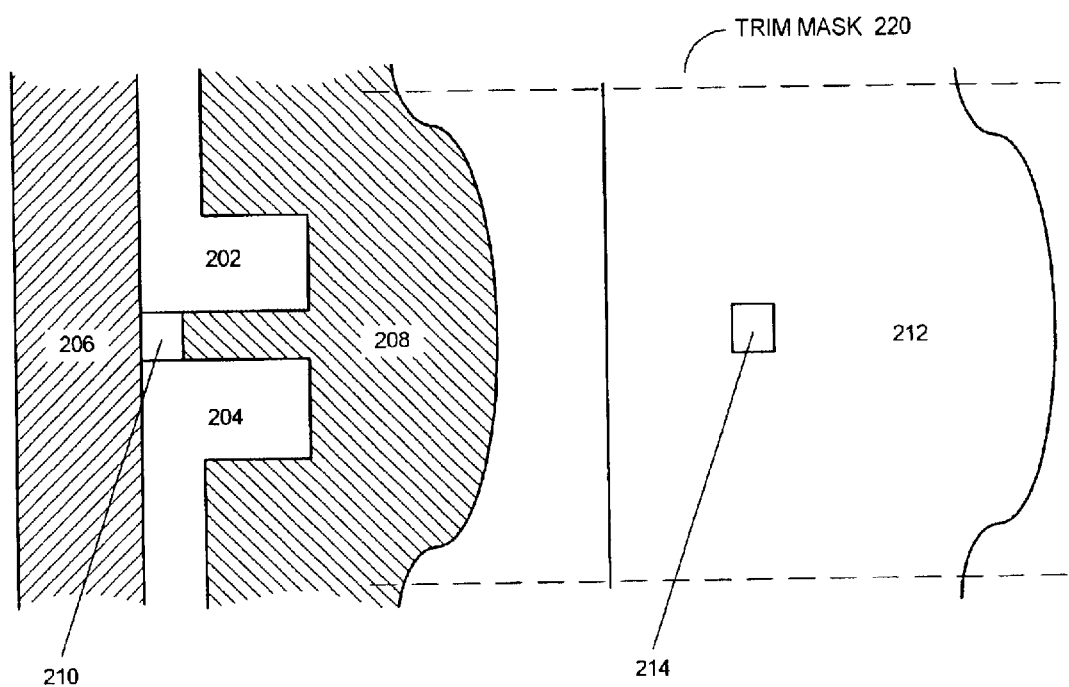
FIG. 2 illustrates how a cutout on a trim mask is used to correct a side-effect generated by phase shifters.
Figure 3A:
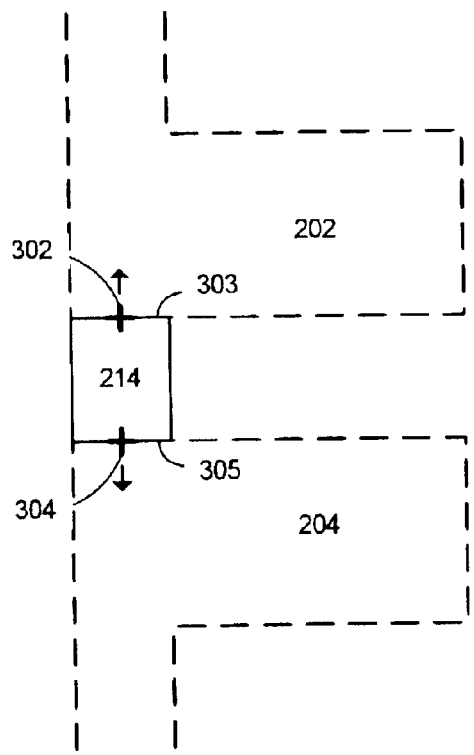
FIG. 3A illustrates a conventional OPC operation on a cutout.

FIG. 3A illustrates a conventional OPC operation on a cutout 214 between two polysilicon regions 202 and 204. During this conventional OPC operation, the system adjusts the upper edge 303 and lower edge 305 of cutout 214 based upon simulation results at evaluation points 302 and 304. If there is not sufficient light passing through cutout 214, upper edge 303 may be adjusted slightly upward and lower edge 305 may be adjusted slightly downward. However, edges 303 and 304 can only be adjusted a limited amount without significantly altering the shapes of the abutting polysilicon regions 202 and 204.

Figure 3B:
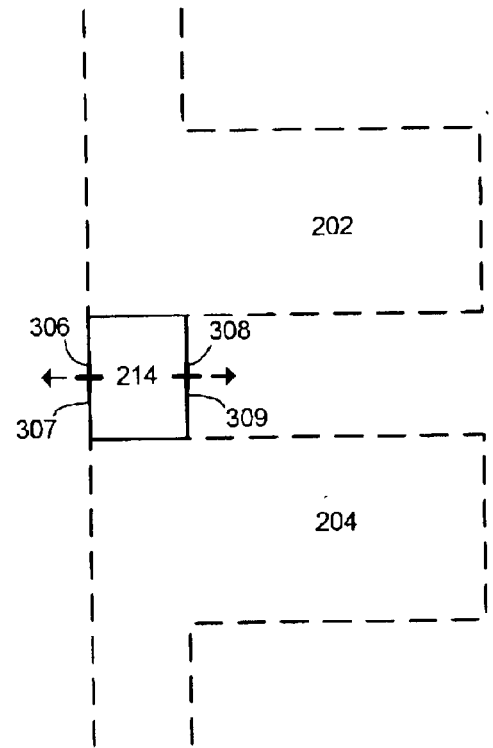
FIG. 3B illustrates new type of OPC operation on the cutout in accordance with an embodiment of the invention.

FIG. 3B illustrates a new type of OPC operation on cutout 214 in accordance with an embodiment of the invention. Unlike the conventional OPC operation illustrated in FIG. 3A, this new type of OPC operation first adjusts the trim segments that do not abut features to be printed (see discussion of FIG. 5 for more details of the process). More specifically, the OPC operation adjusts the left edge 307 and the right edge 309 of cutout 214 based upon simulation results at evaluation points 306 and 308.

Unlike evaluation points 302 and 304 in FIG. 3A, evaluation points 306 and 308 are not located on the boundary of a printing feature. Hence, the simulation results are not matched against a desired location for the boundary of the printed feature. Instead, the simulation results at evaluation points 306 and 308 are matched against a target intensity level as is described in more detail below with reference to FIG. 5.

Note that this new type of OPC operation can adjust edges 307 and 309 outward to allow more light to pass through cutout 214. Moreover, the outward expansion of edges 307 and 309 is not constrained by the boundaries of the features to be printed 202 and 204. Hence, cutout 214 can be expanded to allow sufficient light through to completely erase the underlying region 210 between the features to be printed 202 and 204.

Also note that it if cutout 214 is so large that it causes an overexposure of underlying regions, the invention can adjust edges 307 and 309 inward to reduce the amount of the amount of light passing through cutout 214.

Cutout between Line Ends

Figure 4:
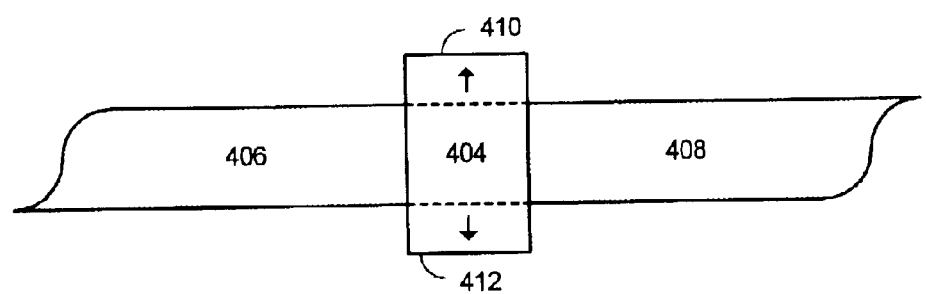
FIG. 4 illustrates a cutout between line ends in accordance with an embodiment of the invention.

FIG. 4 illustrates a cutout 404 that is used to define ends 406 and 408 in accordance with an embodiment of the invention. In this example, the cutout 404 is not necessarily used to clear side effects caused by phase conflicts. Instead, cutout 404 is used to define line ends 406 and 408. As in the example illustrated in FIG. 3B, this new type of OPC operation is used to adjust edges 410 and 412 of cutout 404 that do not abut the features to be printed (line ends 406 and 408). In this way, edges 410 and 412 are adjusted outward to allow sufficient light through to erase underlying regions of the layout.

Process of Applying OPC to Selected Trim-Level Segments

Figure 5:
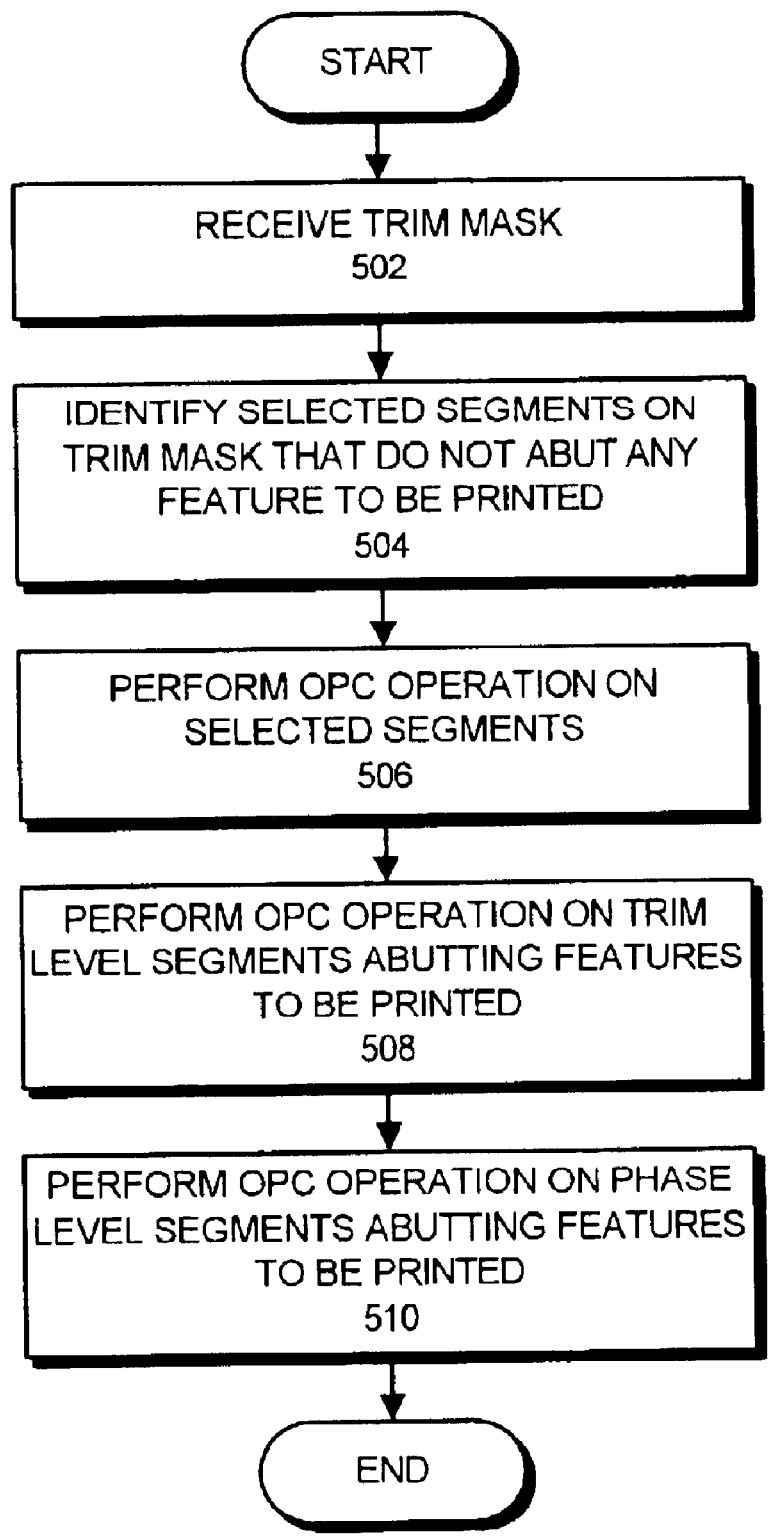
FIG. 5 is a flow chart illustrating how OPC is applied to selected trim-level segments not abutting features to be printed in accordance with an embodiment of the invention.

FIG. 5 is a flow chart illustrating how OPC is applied to selected trim level segments not abutting features to be printed in accordance with an embodiment of the invention. During the process of generating masks for the optical lithography process, the system receives a trim mask (step 502).

Next, the system identifies selected segments on the trim mask that do not abut any features to be printed (step 504). In one embodiment of the invention, this involves identifying selected segments that belong to cutouts on the trim mask that do not abut features to be printed. Note that these cutouts can be used to clear unwanted phase conflicts generated by a phase shifting mask. Alternatively, the cutouts can be used for other purposes, such as defining line ends as is illustrated in FIG. 4. In identifying the selected segments, the system can look for specific cutouts that are too small to allow sufficient light through to erase underlying features. The system can also look for specific cutouts that are so large as to cause overexposure of the underlying regions.

Also, the selected segments can be segments that are part of "assist features" on the trim mask. Note that assist features are feature that do not actually print themselves and do not have any substantial residual intensity. Instead, they "assist" in printing other features. Moreover, the assist features can be in-phase or out-of-phase with other features on the trim mask.

The system then performs a first optical proximity operation on the selected segments (step 506). Since, these selected segments do not lie on the boundary of a feature to be printed, the first OPC operation does not seek to match a printed location for a feature with a target location at an evaluation point. Instead, the first OPC operation seeks to match a target intensity level at the evaluation points. This target intensity level can be different than a "feature-defining intensity level" associated with a resist trigger that defines printed edges of features. For example, the target intensity level used for evaluation points on non-abutting segments can be lower than the feature-defining intensity level used for abutting segments. Moreover, this target intensity level can include a range of intensity levels that suffice to erase underlying features on the integrated circuit. Note that the goal is to achieve about the same intensity level for all cuts.

Next, the system performs a second OPC operation on trim-level segments abutting features to be printed (step 508) as well as a third OPC operation on phase-level segments abutting features to be printed (step 510). Note that the first, second and third OPC operations can be performed independently or at the same time.

Also note during the first OPC operation that the selected segments on the trim mask can be corrected based only on a contribution of the trim mask. Alternatively, during the first OPC operation the selected segments on the trim mask can be corrected based on a contribution of the trim mask as well as a contribution of an associated phase shifting mask.

The OPC process of FIG. 5 can be incorporated into the PSM and OPC post-processing for a given design. The resulting masks (or mask set) can then be used in wafer fabrication processes to produce integrated circuits.

EXAMPLE

Figure 6:
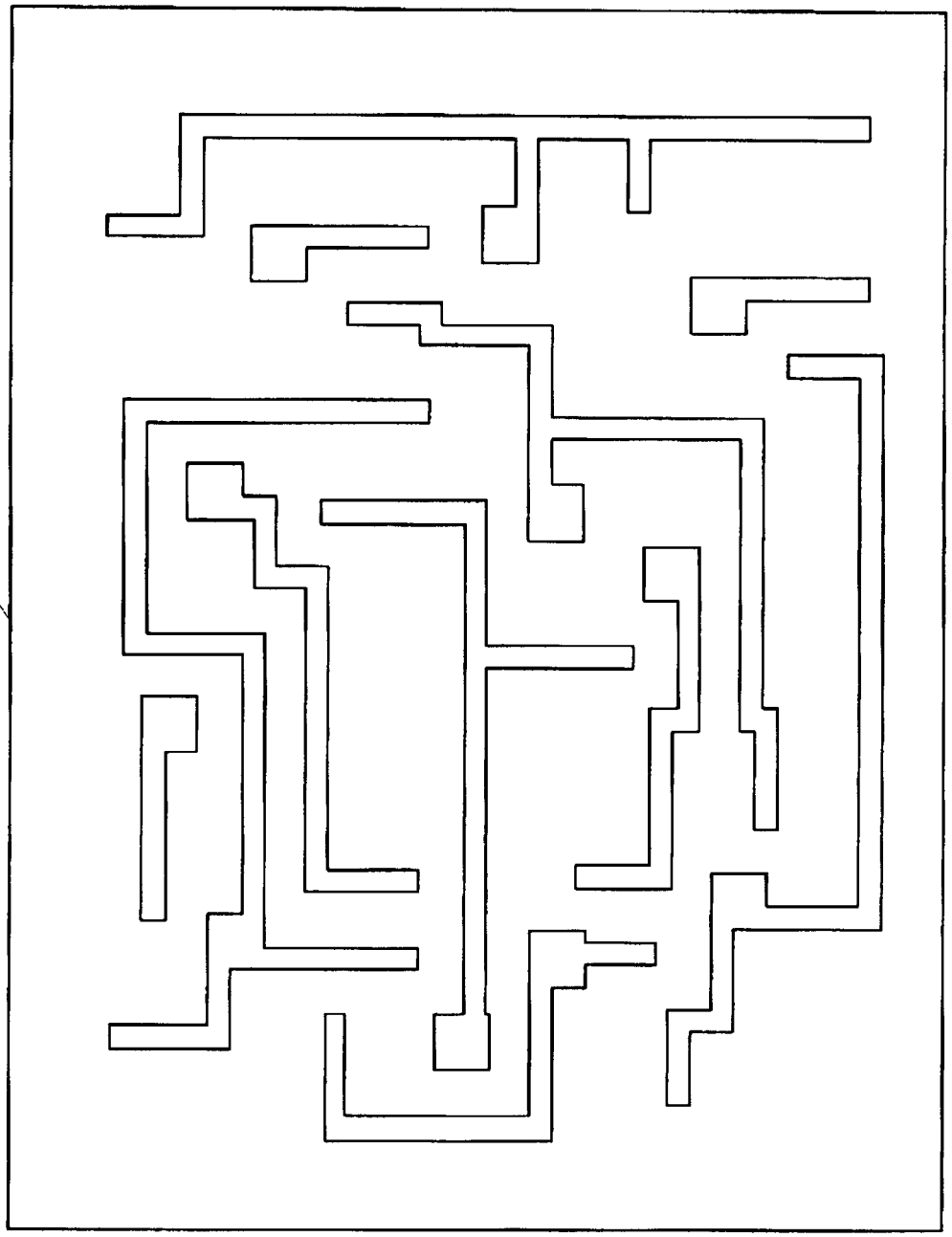
FIG. 6 illustrates a target layout in accordance with an embodiment of the invention.

FIG. 6 illustrates an exemplary target layout 600 in accordance with an embodiment of the invention. This target layout 600 is printed using a PSM mask and a trim mask (shown in FIGS. 7 and 8, respectively). The PSM and trim masks can be generated manually or through automated processes. For example, the PSM mask could be generated using the methods and apparatuses described in U.S. patent application Ser. No. 10/085,759 entitled "Design And Layout Of Phase Shifting Photolithographic Masks" having inventor Christophe Pierrat, et. al., and assigned to the assignee of the present application.

Figure 7:
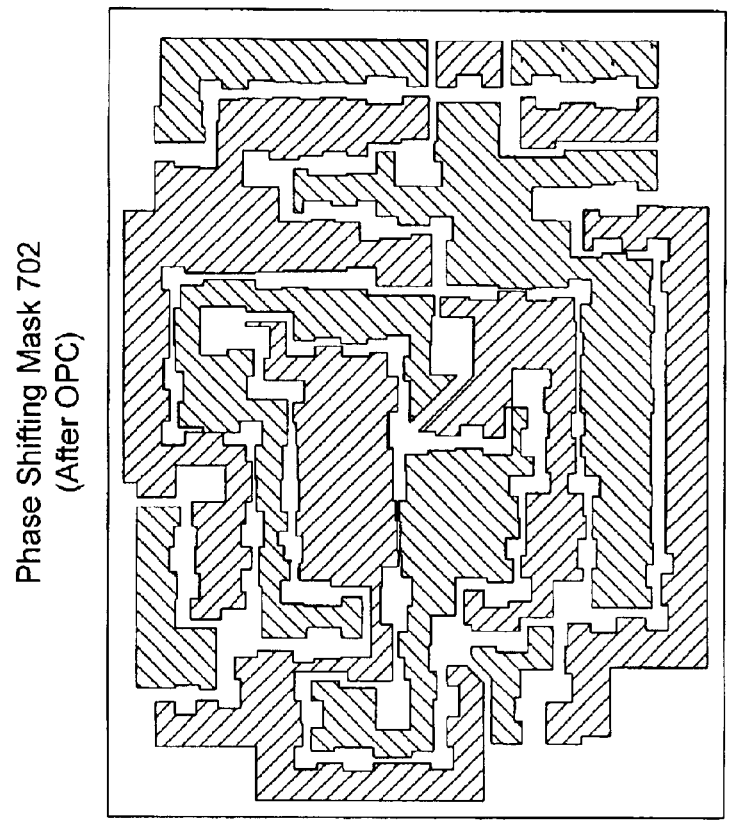
FIG. 7 illustrates a PSM mask before correction and after correction in accordance with an embodiment of the invention.
Figure 7:
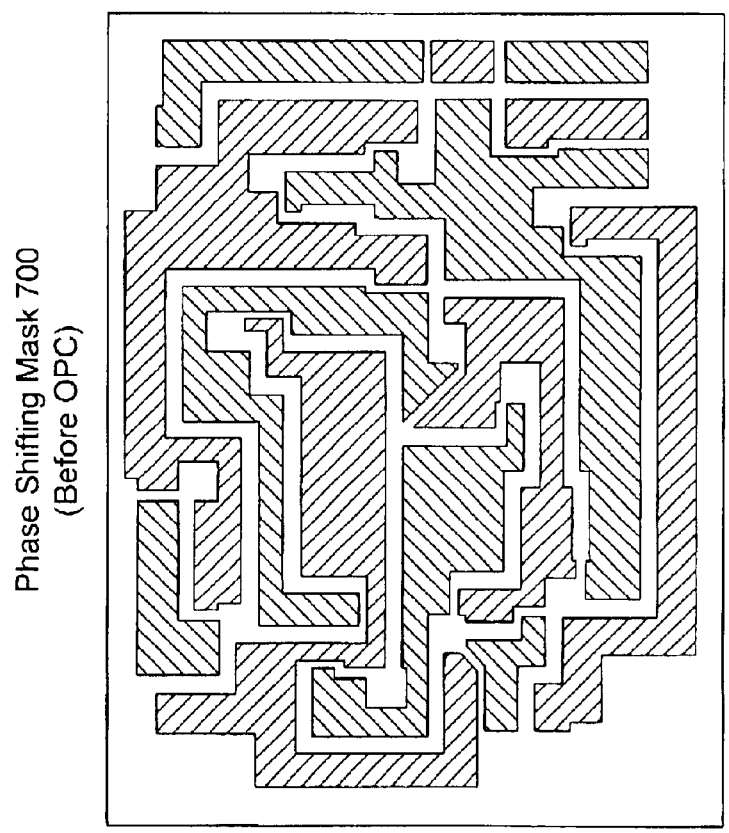

The PSM mask is run through an OPC process to correct segments abutting features to be printed and the result is illustrated in FIG. 7. Specifically, FIG. 7 includes phase shifting mask 700 and phase shifting mask 702. The phase shifting mask 700 shows the layout for the pre-OPC phase shifting mask for the layout 600. The phase shifting mask

702 shows the layout of the phase shifting mask 700 after the application of OPC (e.g. as in step 510 of FIG. 5).

Figure 8:
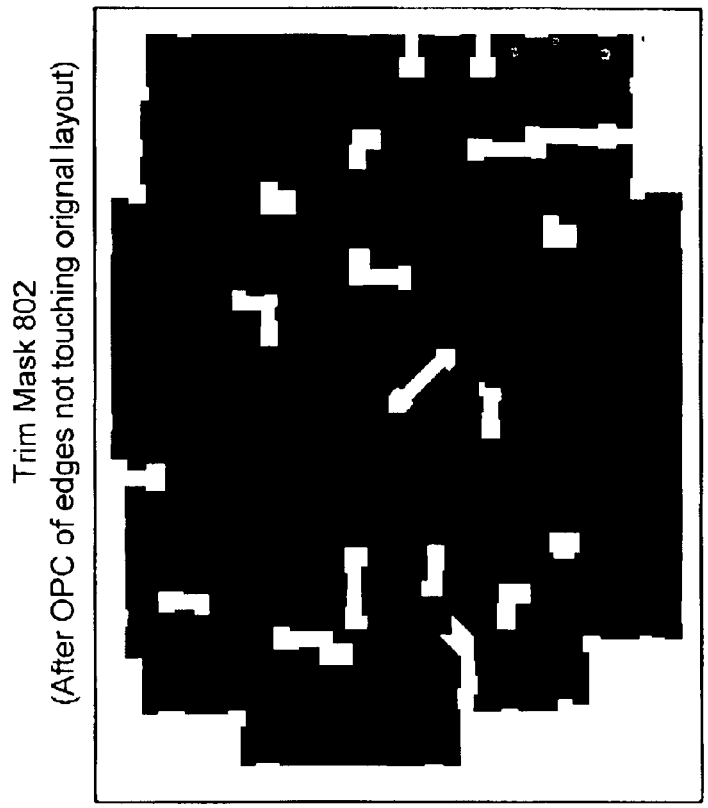
FIG. 8 illustrates a trim mask before correction and after correction of edges not abutting the original layout in accordance with an embodiment of the invention.
Figure 8:
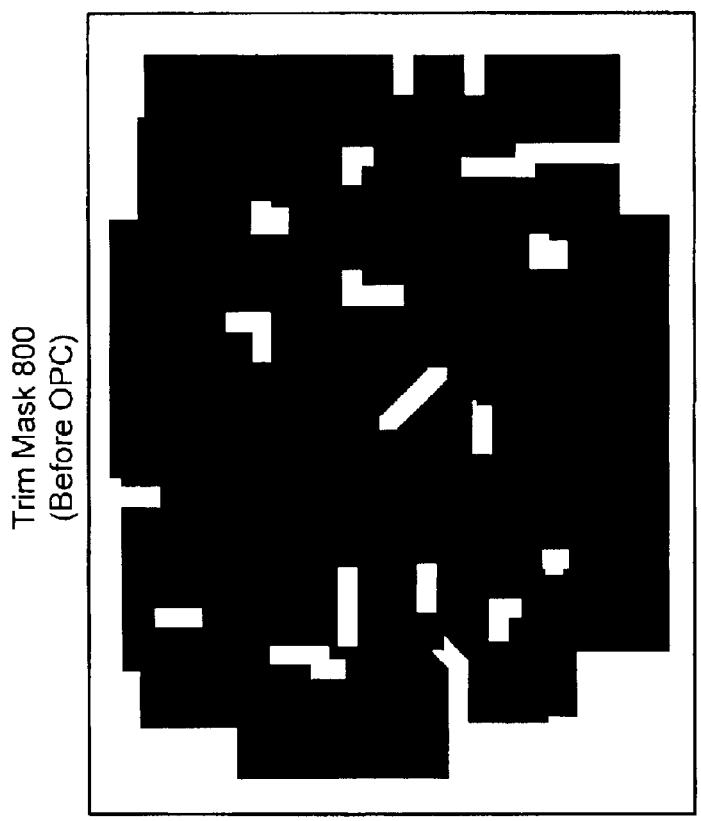

The trim mask is also run through an OPC process and the result is illustrated in FIG. 8. Specifically, FIG. 8 includes trim mask 800 and trim mask 802. The trim mask 800 shows the layout for the pre-OPC trim mask for the layout 600. The trim mask 802 shows the layout of the trim mask 800 after application of OPC solely to segments not abutting features that will be printed (e.g. after steps 504 and 506 of FIG. 5), see FIG. 10 for the finished trim mask 1000 after all OPC is complete (e.g. after step 508).

Figure 9:
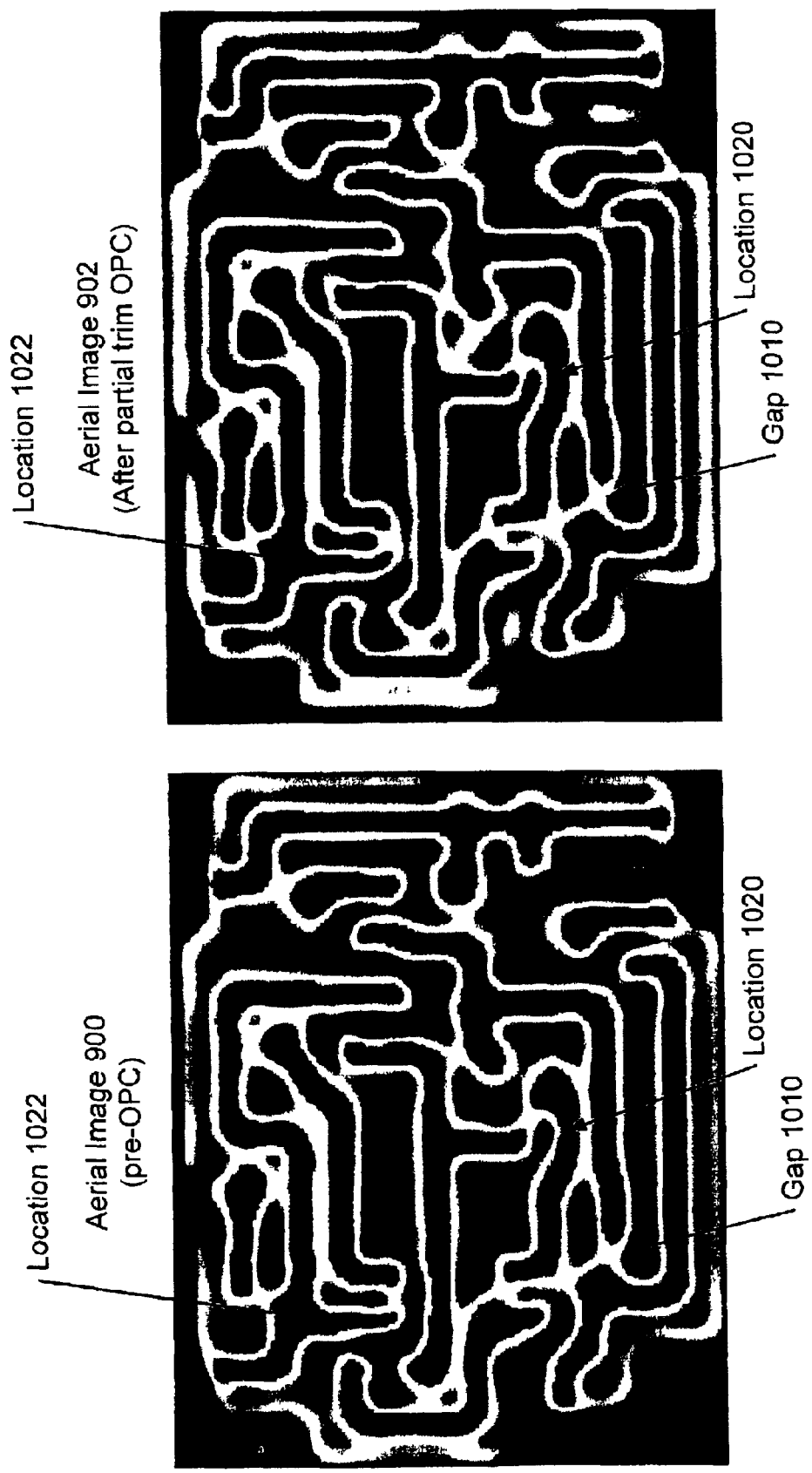
FIG. 9 illustrates aerial images showing benefits of embodiments of the invention.

FIG. 9 illustrates aerial images showing benefits of embodiments of the invention. Specifically, two aerial images are shown. On the left is aerial image 900 corresponding to use of the trim mask 800 (pre-OPC) and the phase shifting mask 700 (pre-OPC). On the right is aerial image 902 corresponding to use of the trim mask 802 (post-OPC of edges not abutting features) and the phase shifting mask 800 (pre-OPC).

Benefits of embodiments of the invention can be seen in these two images. First, better clearing of the gaps is apparent, due to the larger cut (e.g. contrast gap 1010 on both images). Additionally, less light is leaking from cuts to adjacent features (e.g. contrast the locations 1020 and 1022 on both images.)

Figure 10:
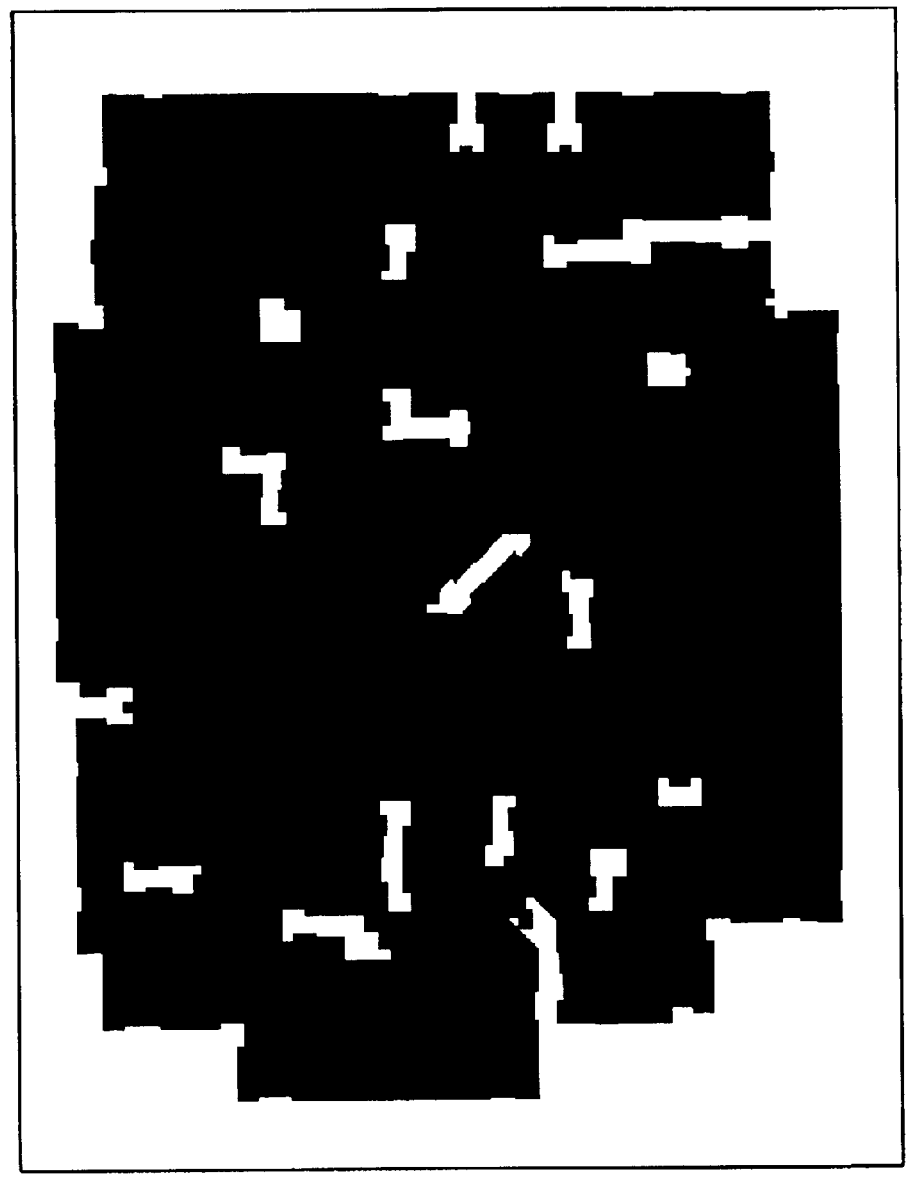
FIG. 10 illustrates the final trim layout after OPC of edges touching the original layout.

FIG. 10 illustrates the final layout for the trim mask 1000 after OPC of edges touching the original layout. This layout could be generated by step 508 of the process of FIG. 5. This trim mask 1000 could be used in conjunction with the phase shifting mask 702 when producing integrated circuits.

CONCLUSION

The foregoing description is presented to enable one to make and use the invention, and is provided in the context of a particular application and its requirements. It is not intended to be exhaustive or to limit the invention to the forms disclosed. Various modifications to the disclosed embodiments will be readily apparent, and the general principles defined herein may be applied to other embodiments and applications without departing from the spirit and scope of the invention. Thus, the invention is not intended to be limited to the embodiments shown, but is to be accorded the widest scope consistent with the principles and features disclosed herein. Accordingly, many modifications and variations will be apparent. The scope of the invention is defined by the appended claims.

The data structures and code described in this detailed description can be stored on a computer readable storage medium, which may be any device or medium that can store code and/or data for use by a computer system. This includes, but is not limited to, magnetic and optical storage devices such as disk drives, magnetic tape, CDs (compact discs) and DVDs (digital versatile discs or digital video discs), and computer instruction signals embodied in a transmission medium (with or without a carrier wave upon which the signals are modulated). For example, the transmission medium may include a communications network, such as the Internet. And the computer instruction signals may correspond to OPC programs accessed over a network, e.g. for performing the process of FIG. 5.

Note that the invention can be applied to any type of lithographic process for fabricating semiconductor chips, including processes that make use of, deep-ultraviolet (DUV) radiation, extreme ultraviolet (EUV) radiation, X-rays, and electron beams, along with suitably modified masks.

What is claimed is:

1. A method for performing optical proximity correction (OPC) on selected segments on a trim mask used in fabricating an integrated circuit, wherein the selected segments do not abut any feature to be printed on the integrated circuit, the method comprising:

receiving the trim mask for the integrated circuit;

identifying the selected segments on the trim mask that do not abut any feature to be printed on the integrated circuit;

performing a first OPC operation on the selected segments to correct the selected segments;

performing a second OPC operation to correct segments on the trim mask that do abut features to be printed on the integrated circuit; and performing a third OPC operation on an associated phase shifting mask to correct segments that abut features to be printed on the integrated circuit.

2. The method of claim 1, wherein for a given selected segment, the first OPC operation attempts to ensure a pre-specified intensity level on at least one evaluation point on the given selected segment.

3. The method of claim 2, wherein the pre-specified intensity level is different than a feature-defining intensity level; and wherein the feature-defining intensity level is associated with a resist trigger that defines printed edges of features within the integrated circuit.

4. The method of claim 2, wherein the pre-specified intensity level includes a range of intensity levels that suffice to erase underlying features on the integrated circuit.

5. The method of claim 1, wherein identifying the selected segments involves identifying segments associated with a set of cutouts on the trim mask.

6. The method of claim 5, wherein the set of cutouts includes cutouts that erase side-effects generated by transitions between zero-degree regions and 180-degree regions on an associated phase shifting mask.

7. The method of claim 5, wherein the set of cutouts includes cutouts that define line ends.

8. The method of claim 1, wherein the first OPC operation, the second OPC operation and the third OPC operation are performed at the same time.

9. The method of claim 1, wherein the selected segments on the trim mask are corrected based only on a contribution of the trim mask.

10. The method of claim 1, wherein the selected segments on the trim mask are corrected based on a contribution of the trim mask as well as a contribution of an associated phase shifting mask.

11. The method of claim 1, wherein identifying the selected segments involves identifying segments associated with features on the trim mask that are too small to expose an underlying photoresist layer.

12. The method of claim 1, wherein identifying the selected segments involves identifying segments associated with features on the trim mask that are so large that the features cause an overexposure of an underlying photoresist layer.

13. The method of claim 1, wherein identifying the selected segments on the trim mask involves identifying segments associated with assist features; and wherein the assist features are non-printing features that assist in printing other features on the integrated circuit.

14. A method for performing optical proximity correction (OPC) on selected segments on a trim mask used in fabricating an integrated circuit, wherein the selected segments do not abut any feature to be printed on the integrated circuit, the method comprising:

receiving the trim mask for the integrated circuit;

identifying the selected segments on the trim mask that do not abut any feature to be printed on the integrated circuit; and performing a first OPC operation on the selected segments to correct the selected segments.

15. A computer-readable storage medium storing instructions that when executed by a computer cause the computer to perform a method for performing optical proximity correction (OPC) on selected segments on a trim mask used in fabricating an integrated circuit, the method comprising:

receiving the trim mask for the integrated circuit;

identifying the selected segments on the trim mask that do not abut any feature to be printed on the integrated circuit;

performing a first OPC operation on the selected segments to correct the selected segments;

performing a second OPC operation to correct segments on the trim mask that do abut features to be printed on the integrated circuit; and performing a third OPC operation on an associated phase shifting mask to correct segments that abut features to be printed on the integrated circuit.

16. The computer-readable storage medium of claim 15, wherein for a given selected segment, the first OPC operation attempts to ensure a pre-specified intensity level on at least one evaluation point on the given selected segment.

17. The computer-readable storage medium of claim 16,
wherein the pre-specified intensity level is different than a feature-defining intensity level; and
wherein the feature-defining intensity level is associated with a resist trigger that defines printed edges of features within the integrated circuit.

18. The computer-readable storage medium of claim 16, wherein the pre-specified intensity level includes a range of intensity levels that suffice to erase underlying features on the integrated circuit.

19. The computer-readable storage medium of claim 15, wherein identifying the selected segments involves identifying segments associated with a set of cutouts on the trim mask.

20. The computer-readable storage medium of claim 19, wherein the set of cutouts includes cutouts that erase side-effects generated by transitions between zero-degree regions and 180-degree regions on an associated phase shifting mask.

21. The computer-readable storage medium of claim 19, wherein the set of cutouts includes cutouts that define line ends.

22. The computer-readable storage medium of claim 15, wherein the first OPC operation, the second OPC operation and the third OPC operation are performed at the same time.

23. The computer-readable storage medium of claim 15, wherein the selected segments on the trim mask are corrected based only on a contribution of the trim mask.

24. The computer-readable storage medium of claim 15, wherein the selected segments on the trim mask are corrected based on a contribution of the trim mask as well as a contribution of an associated phase shifting mask.

25. The computer-readable storage medium of claim 15, wherein identifying the selected segments involves identifying segments associated with features on the trim mask that are too small to expose an underlying photoresist layer.

26. The computer-readable storage medium of claim 15, wherein identifying the selected segments involves identifying segments associated with features on the trim mask that are so large that the features cause an overexposure of an underlying photoresist layer.

27. The computer-readable storage medium of claim 15,
wherein identifying the selected segments on the trim mask involves identifying segments associated with assist features; and
wherein the assist features are non-printing features that assist in printing other features on the integrated circuit.

28. An apparatus that performs optical proximity correction (OPC) on selected segments on a trim mask used in fabricating an integrated circuit, wherein the selected segments do not abut any feature to be printed on the integrated circuit, the apparatus comprising:

a receiving mechanism configured to receive the trim mask for the integrated circuit;

an identification mechanism configured to identify the selected segments on the trim mask that do not abut any feature to be printed on the integrated circuit; and an OPC mechanism configured to perform a first OPC operation on the selected segments to correct the selected segments;

wherein the OPC mechanism is additionally configured to perform a second OPC operation to correct segments on the trim mask that do abut features to be printed on the integrated circuit;

wherein the OPC mechanism is additionally configured to perform a third OPC operation on an associated phase shifting mask to correct segments that abut features to be printed on the integrated circuit.

29. The apparatus of claim 28, wherein for a given selected segment, the first OPC operation attempts to ensure a pre-specified intensity level on at least one evaluation point on the given selected segment.

30. The apparatus of claim 29,
wherein the pre-specified intensity level is different than a feature-defining intensity level; and
wherein the feature-defining intensity level is associated with a resist trigger that defines printed edges of features within the integrated circuit.

31. The apparatus of claim 29, wherein the pre-specified intensity level includes a range of intensity levels that suffice to erase underlying features on the integrated circuit.

32. The apparatus of claim 28, wherein the identification mechanism is configured to identify segments associated with a set of cutouts on the trim mask.

33. The apparatus of claim 32, wherein the set of cutouts includes cutouts that erase side-effects generated by transitions between zero-degree regions and 180-degree regions on an associated phase shifting mask.

34. The apparatus of claim 32, wherein the set of cutouts includes cutouts that define line ends.

35. The apparatus of claim 28, wherein the OPC mechanism is configured to perform first OPC operation, the second OPC operation and the third OPC operation at the same time.

36. The apparatus of claim 28, wherein the OPC mechanism is configured to correct the selected segments on the trim mask based only on a contribution of the trim mask.

37. The apparatus of claim 28, wherein the OPC mechanism is configured to correct the selected segments on the trim mask based on a contribution of the trim mask as well as a contribution of an associated phase shifting mask.

38. The apparatus of claim 28, wherein the identification mechanism is configured to identify segments associated with features on the trim mask that are too small to expose an underlying photoresist layer.

39. The apparatus of claim 28, wherein the identification mechanism is configured to identify segments associated with features on the trim mask that are so large that the features cause an overexposure of an underlying photoresist layer.

40. The apparatus of claim 28,
wherein the identification mechanism is configured to identify segments associated with assist features; and
wherein the assist features are non-printing features that assist in printing other features on the integrated circuit.

41. A means for performing optical proximity correction (OPC) on selected segments on a trim mask used in fabricating an integrated circuit, comprising:
a receiving means for receiving the trim mask for the integrated circuit;
an identification means for identifying the selected segments on the trim mask that do not abut any feature to be printed on the integrated circuit; and
an OPC means for performing a first OPC operation on the selected segments to correct the selected segments.

42. An integrated circuit created through a process that performs optical proximity correction (OPC) on selected segments on a trim mask used in fabricating the integrated circuit, the process comprising:
receiving the trim mask for the integrated circuit;
identifying the selected segments on the trim mask that do not abut any feature to be printed on the integrated circuit; and
performing a first OPC operation on the selected segments to correct the selected segments.

43. A trim mask to be used in an optical lithography process for manufacturing an integrated circuit, wherein the trim mask is created through a method that performs optical proximity correction (OPC) on selected segments on the trim mask, method comprising:
receiving the trim mask for the integrated circuit;
identifying the selected segments on the trim mask that do not abut any feature to be printed on the integrated circuit; and
performing a first OPC operation on the selected segments to correct the selected segments.

44. A method for performing optical proximity correction (OPC) on selected segments on a mask used in fabricating an integrated circuit, wherein the selected segments do not abut any feature to be printed on the integrated circuit, the method comprising:
receiving the mask for the integrated circuit;
identifying the selected segments on the mask that do not abut any feature to be printed on the integrated circuit;
performing a first OPC operation on the selected segments to correct the selected segments; and
performing a second OPC operation to correct segments on the mask that do abut features to be printed on the integrated circuit.

45. The method of claim 44 further comprising:
performing a third OPC operation on an associated phase shifting mask to correct segments that abut features to be printed on the integrated circuit.

* * * * *